(12) United States Patent
Mack et al.

(10) Patent No.: US 6,831,272 B2
(45) Date of Patent: Dec. 14, 2004

(54) GAS CLUSTER ION BEAM SIZE DIAGNOSTICS AND WORKPIECE PROCESSING

(75) Inventors: Michael E. Mack, Manchester, MA (US); Richard P. Torti, Burlington, MA (US)

(73) Assignee: Epion Corporation, Billerica, MA (US)

( * ) Notice: Subject to any disclaimer, the term of this patent is extended or adjusted under 35 U.S.C. 154(b) by 0 days.

(21) Appl. No.: 09/904,919

(22) Filed: Jul. 13, 2001

(65) Prior Publication Data

US 2002/0070361 A1 Jun. 13, 2002

Related U.S. Application Data

(60) Provisional application No. 60/218,248, filed on Jul. 14, 2000.

(51) Int. Cl.[7] .................... B01D 58/44; H01J 49/00
(52) U.S. Cl. .................. 250/287; 250/257; 250/282
(58) Field of Search ................ 204/192.1; 427/450, 427/523; 250/287, 282, 257

(56) References Cited

U.S. PATENT DOCUMENTS 3,634,683 A * 1/1972 Bakker .................. 250/41.9
4,217,855 A     8/1980 Takagi
5,110,435 A * 5/1992 Haberland ................. 427/523
5,111,042 A     5/1992 Sullivan et al.
5,166,521 A    11/1992 Hayashi et al.
5,770,857 A     6/1998 Fuerstenau et al.

FOREIGN PATENT DOCUMENTS

DE          41 35 504 A1     4/1993

* cited by examiner

Primary Examiner—Hai Pham
Assistant Examiner—Lam S Nguyen
(74) Attorney, Agent, or Firm—Perkins Smith & Cohen; Jerry Cohen; John A Hamilton

(57) ABSTRACT

Methods and apparatus for measuring the distribution of cluster ion sizes in a gas cluster ion beam (GCIB) and for determining the mass distribution and mass flow of cluster ions in a GCIB processing system without necessitating the rejection of a portion of the beam through magnetic or electrostatic mass analysis. The invention uses time-of-flight measurement to estimate or monitor cluster ion size distribution either before or during processing of a workpiece. The measured information is displayed and incorporated in automated control of a GCIB processing system.

35 Claims, 19 Drawing Sheets

GAS CLUSTER ION BEAM SIZE DIAGNOSTICS AND WORKPIECE PROCESSING

CROSS REFERENCE TO RELATED PATENT APPLICATIONS

This application claims priority of U.S. Provisional Application Ser. No. 60/218,248 entitled CLUSTER SIZE DETERMINATION, filed Jul. 14, 2000, the provisional application being incorporated herein by reference.

BACKGROUND OF THE INVENTION

This invention relates generally to the measurement of the size distribution of gas clusters in gas cluster ion beams, and, more particularly to apparatus and methods for the measurement of the size distribution of gas clusters by making time-of-flight measurements.

The use of a gas cluster ion beam (GCIB) for etching, cleaning, and smoothing of material surfaces is known (see for example, U.S. Pat. No. 5,814,194, Deguchi et al.) in the art. For purposes of this discussion, gas clusters are nano-sized aggregates of materials that are gaseous under conditions of standard temperature and pressure. Such clusters typically consist of aggregates of from a few to several thousand molecules loosely bound to form the cluster. Such clusters can be ionized by electron bombardment or other means, permitting them to be formed into directed beams of known and controllable energy. The larger sized clusters are the most useful because of their ability to carry substantial energy per cluster ion, while yet having only modest energy per molecule. The clusters disintegrate on impact, with each individual molecule carrying only a small fraction of the total cluster energy. Consequently the impact effects of large clusters are substantial, but are limited to a very shallow surface region. This makes ion clusters effective for a variety of surface modification processes, without the tendency to produce deeper subsurface damage characteristic of monomer ion beam processing.

Means for creation of and acceleration of such GCIB's are described in the reference (U.S. Pat. No. 5,814,194) previously cited. Presently available ion cluster sources produce clusters ions having a wide distribution of sizes, n (where n=the number of molecules in each cluster—in the case of monatomic gases like argon, an atom of the monatomic gas will be referred to as a molecule and an ionized atom of such a monatomic gas will be referred to as a molecular ion—or simply a monomer ion—throughout this discussion).

To a first order approximation, the surface modification effects of an energetic cluster is dependent on the energy of the cluster. However, second order effects are dependent on the velocity of the cluster which is dependent on both the energy of the cluster and it's mass (and hence the cluster size, n.) In order to maximize the utility of a gas cluster ion beam for surface processing, it is useful to know and control both the energy of the cluster and the cluster size or cluster size distribution. In certain applications gas cluster ion beams are used for deposition or growth of surface films. When thus used, it is important to know the mass flow to the workpiece. The quantity of clusters is readily determined by measuring the cluster ion current that reaches the workpiece. In the usual case, ionized clusters from a practical ionized cluster source, do not necessarily all carry the same number of electrical charges. By suitable selection of ionization conditions, it can be arranged that the cluster ions predominately carry a single electrical charge, and in such case it is accurately assumed that each charge corresponds to a single cluster, but unless the average size or size distribution (average mass or mass distribution) is also known, the total mass flow to the workpiece is not known. It is also possible, by controlling the source conditions, to influence both the ratio of cluster ions to molecular ions and to influence the cluster size distribution as well. However, unless a means is available to measure and monitor the cluster size distribution and the ratio of cluster ions to molecular ions, meaningful adjustment and control of the source conditions for influencing ionized cluster size is difficult. When the ionized clusters do not all predominately carry a single charge or a known number of charges, knowledge of the ionized clusters' mass per charge can also be used as a useful parameter to control or adjust the beam's effectiveness for smoothing, etching, or other processing. For these and other reasons it is useful to have a means of measurement that can provide cluster size distribution information about a gas cluster ion beam or that can provide information about a gas cluster ion beam's cluster-size-per-charge distribution or cluster-mass-per-charge distribution.

Because molecular ions, as well as cluster ions, are produced by presently available cluster ion beam sources, those molecular ions are accelerated and transported to the workpiece being processed along with the cluster ions. Molecular ions, having high energy with low mass results in high velocities, which allow the light molecular ions to penetrate the surface and produce deep damage which is likely to be detrimental to the process. Such sub-surface ion damage is well established and well known from the more traditional monomer ion beam processing art and can produce a variety of deep damage and undesirable implantation.

It has become known in the ion cluster beam art that many GCIB processes benefit from incorporating means within GCIB processing equipment for eliminating molecular ions from the ion cluster beams. Electrostatic (see U.S. Pat. No. 4,737,637, Knauer) and electromagnetic (see Japanese laid open application JP 03-245523, cited as prior art in U.S. Pat. No. 5,185,287, Aoyagi et al.) mass analyzers have been employed to remove light ions from the beam of heavier cluster ions. Electrostatic and electromagnetic mass analyzers have also been employed to select ion clusters having a narrow range of ion masses from a beam containing a wider distribution of masses.

Presently practical GCIB sources produce a broad distribution of ion cluster sizes with limited cluster ion currents available. Therefore it is not practical to perform GCIB processing by selecting a single cluster size or a narrow range of cluster sizes—the available fluence of such a beam is too low for productive processing. It is preferred to eliminate only the molecular ions and other lowest mass ions from the beam and use all remaining heavier ions for processing. Practical experience has shown that it is often sufficient to provide filtering to eliminate molecular ions while depending on the typical cluster size distribution characteristics (few small size clusters are created by typical sources) to limit the small clusters (n=2 to ~10) in the beam. Clusters of size n>10 are adequately large to provide acceptable results in most processes. Since the typical cluster distribution contains clusters of up to n=several thousand and there are few clusters of mass less than 100, it is not significantly detrimental if clusters up to size 100 are removed from the beam in the process of eliminating the molecular ions. However, in order to adequately predict the processing effectiveness of a gas cluster ion beam, it is very desirable to know the distribution of masses or cluster sizes in the beam and to know whether molecular ions and the smallest size cluster ions are present or not.

It is therefore an object of this invention to provide a way of measuring the mean cluster ion size or mass in a GCIB.

It is also an object of the invention to provide means to determine the cluster size (or mass) distribution or the mass flow of cluster ions in a GCIB processing system without necessitating the rejection of a portion of the beam through magnetic or electrostatic mass analysis.

It is also an object of the invention to determine the presence or absence in a GCIB of undesirable molecular ions.

SUMMARY OF THE INVENTION

The objects set forth above as well as further and other objects and advantages of the present invention are achieved by the embodiments of the invention described hereinbelow.

In the present invention it is preferably arranged that the molecular and cluster ions produced in an ionization system for gas clusters predominantly carry a single electrical charge and such ions are accelerated through a known acceleration potential. Based thereon, the ions, both molecular ions and cluster ions, in a GCIB produced in the apparatus of the invention have known and controllable energies per ion, regardless of cluster size or whether the ion is a cluster or a molecular ion. Since the ions are all generated from a pure gas, the molecular weight of each molecule is known. Therefore, by measuring the times-of-flight of the known ions of known energy over a known distance, it is possible according to the invention to calculate the cluster size distribution function for the ions in the beam. Alternatively, when it is not practical or not desired to arrange that all molecular and cluster ions produced in the gas cluster ionization system predominately carry a single electrical charge, in the present invention, by measuring the times-of-flight of the ions to calculate the cluster size per charge of the ions. The times-of-flight are determined by analyzing the fall-off of the GCIB current when the GCIB is abruptly terminated.

By providing a suitable beam gating method and introducing appropriate sensing apparatus in a conventional GCIB processor, the invention makes an in situ capability for measurement of the mass and cluster size distribution of the ions in a GCIB. The invention can measure either the mean cluster size (or mass) or the distribution of cluster sizes (or masses) in a GCIB.

For a better understanding of the present invention, together with other and further objects thereof, reference is made to the accompanying drawings and detailed description and its scope will be pointed out in the appended claims.

DETAILED DESCRIPTION OF THE PREFERRED EMBODIMENTS

Figure 1:
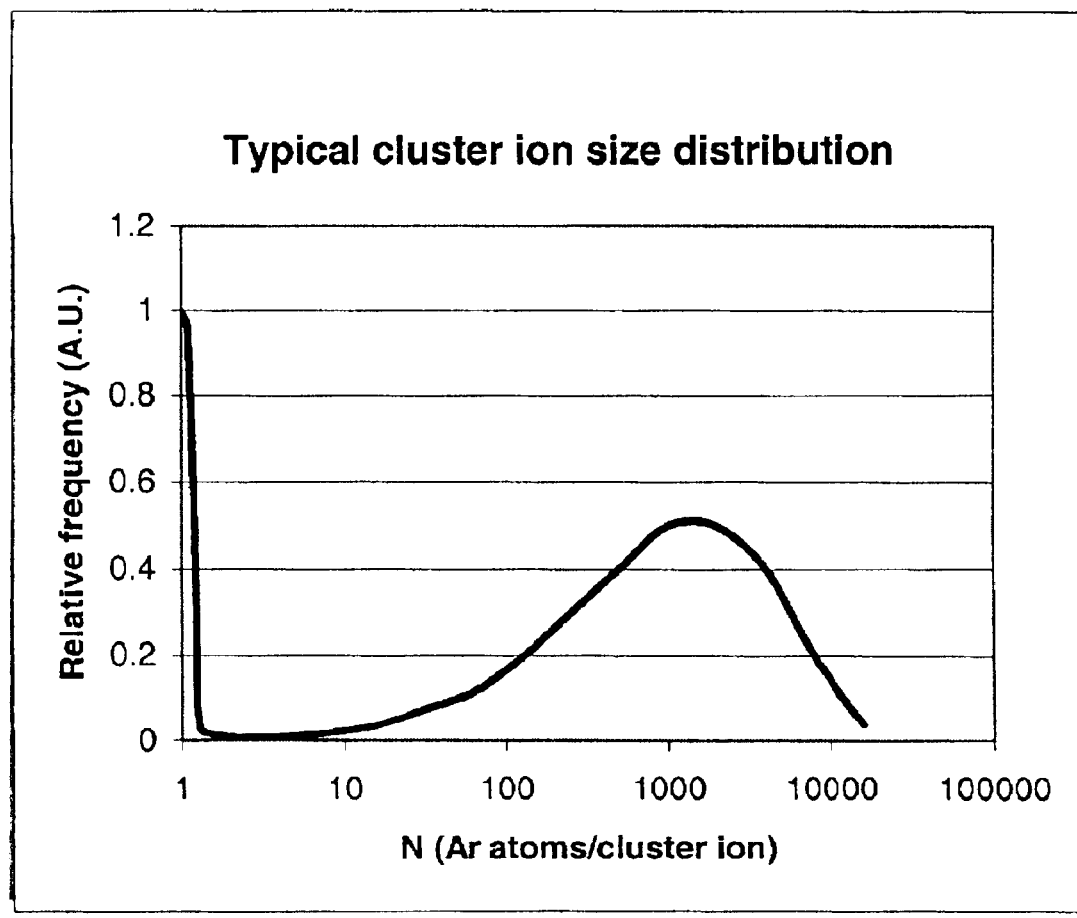
FIG. 1 is a graph showing typical ion cluster size distribution for GICB source.

FIG. 1 shows the typical ion cluster size distribution produced by a commonly available GICB source. The cluster formation process has been shown (in N. Kofuji, et al., Development of gas cluster source and its characteristics, Proc. 14th *Symp. on Ion Sources and Ion-Assisted Technology,* Tokyo (1991) p. 15) to produce few small size clusters (values of N from 2 to about 10), but molecular ions (n=1) are produced in abundance as are larger clusters ( n>a few tens, up to a few thousands.) It is known from the teachings of U.S. Pat. No. 5,459,326, Yamada, that molecules in a cluster are not individually energetic enough (on the order of a few electron volts) to significantly penetrate a surface to cause the residual surface damage typically associated with the other types of ion beam processing in which individual molecular ions may have energies on the order of thousands of electron volts. Nevertheless, according to Yamada and Matsuo, Cluster ion beam processing, *Natl. Science in Semiconductor Processing I,* (1998) pp. 27–41, the clusters themselves can be made sufficiently energetic (some thousands of electron volts), to effectively etch, smooth or clean surfaces.

Figure 2:
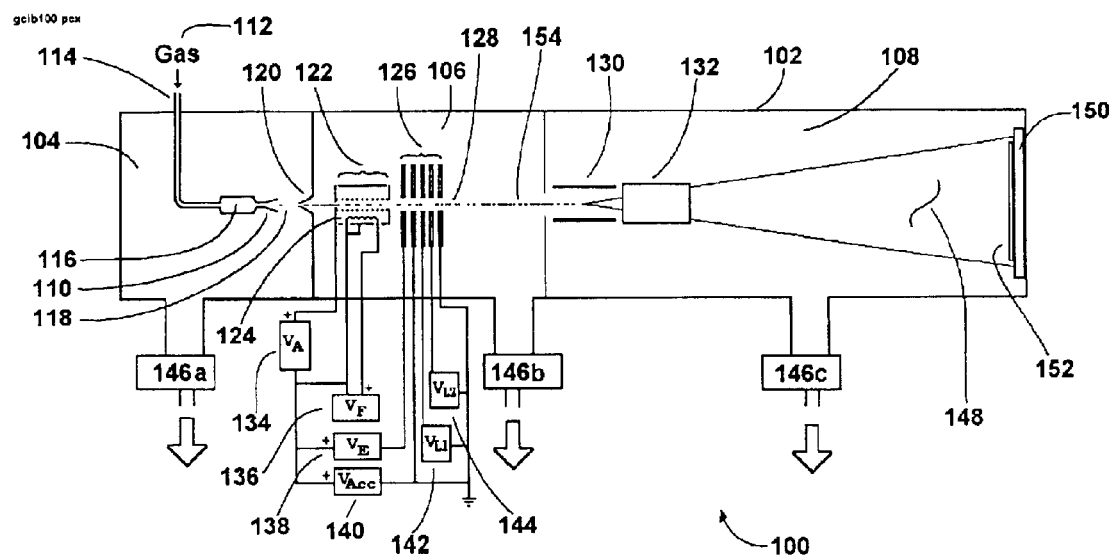
FIG. 2 is a schematic showing the basic elements of a prior art GCIB processing system.

FIG. 2 shows a typical configuration for a GCIB processor 100 of a form known in prior art, and which may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A condensable source gas 112 (for example argon or $N_2$) is admitted under pressure through gas feed tube 114 to stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from a few to several thousand weakly bound molecules. A gas skimmer aperture 120 separates the gas products that have not been formed into a cluster jet from the cluster jet so as to minimize pressure in the downstream regions where such higher pressures would be detrimental (e.g., ionizer 122, high voltage electrodes 126, and process chamber 108). Suitable condensable source gases 112 include, but are not limited to argon, nitrogen, carbon dioxide, oxygen, and other gases.

After the supersonic gas jet 118 containing gas clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas clusters in the gas jet 118, where the jet passes through the ionizer 122. The electron impact ejects electrons from the clusters, causing a portion the clusters to become positively ionized. A set of suitably biased high voltage electrodes 126 extracts the cluster ions from the ionizer, forming a beam, then accelerates them to a desired energy (typically from 1 keV to several tens of keV) and focuses them to form a GCIB 128 having an initial trajectory 154. Filament power supply 136 provides voltage $V_F$ to heat the ionizer filament 124. Anode power supply 134 provides voltage $V_A$ to accelerate thermoelectrons emitted from filament 124 to cause them to bombard the cluster containing gas jet 118 to produce ions. Extraction power supply 138 provides voltage $V_E$ to bias a high voltage electrode to extract ions from the ionizing region of ionizer 122 and to form a GCIB 128. Accelerator power supply 140 provides voltage $V_{ACC}$ to bias a high voltage electrode with respect to the ionizer 122 so as to result in a total GCIB acceleration energy equal to $V_{ACC}$. One or more lens power supplies (142 and 144 shown for example) may be provided to bias high voltage electrodes with potentials ($V_{L1}$ and $V_{L2}$ for example) to focus the GCIB 128.

A workpiece 152, which may be a semiconductor wafer, a thin film on a substrate, or other workpiece to be processed by GCIB processing, is held on a workpiece holder 150, disposed in the path of the GCIB 128. Since most applications contemplate the processing of large workpieces with spatially uniform results, a scanning system is desirable to uniformly scan the GCIB 128 across large areas to produce spatially homogeneous results. Two pairs of orthogonally oriented electrostatic scan plates 130 and 132 can be utilized to produce a raster or other scanning pattern across the desired processing area. When beam scanning is performed, the GCIB 128 is converted into a scanned GCIB 148, which scans the entire surface of workpiece 152.

Figure 3:
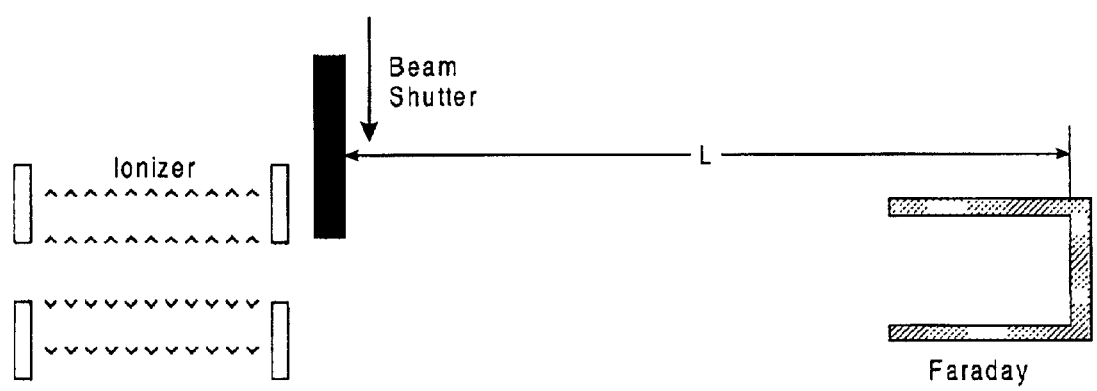
FIG. 3 shows a schematic of the concept for in situ cluster size determination by time-of-flight measurement.

FIG. 3 shows some basic concepts of the invention for measuring cluster size. A beam gating device (shown here as a mechanical shutter, for example, and different embodiments of which are discussed in more detail later) rapidly shuts off or restores the beam. When the beam is shut off by the beam gate, this leaves, in space, a cylinder of ionized beam, at an upstream location (for example at the exit of the ionizer), which continues to move toward the workpiece where it may be measured by a current measuring device such as a Faraday cup dosimeter. The current to the Faraday cup would then be expected to remain constant until the lightest clusters travel the distance, L, from the shutter to Faraday cup and then to drop to zero by the time the heaviest clusters have traveled this same distance, L. The current measured at the Faraday cup falls to half its initial value in the time required for the average sized cluster to transverse distance, L. In other words, the half-current delay time is given in Eqn. 1:

$$T_{50\%} = L\sqrt{\frac{m_p m_a N}{2qV_{Acc}}} \qquad \text{Eqn. 1}$$

where N is the average cluster size, $m_p$ is the mass of a proton, and $m_a$ is the mass in atomic mass units of a single molecule in the cluster, q is the ion charge (=e, the electronic charge), and $V_{ACC}$ is the acceleration voltage for the ions. Of course, Eqn. 1 can be inverted to determine N:

$$N = \frac{2qV_{Acc}}{m_p m_a}\left(\frac{T_{50\%}}{L}\right)^2 \qquad \text{Eqn. 2}$$

To explore this further a simple model was developed by assuming that the cluster number distribution is distributed according to a normal (Gaussian) distribution. In that case the cluster size distribution, f(n), is $$f(n) = \frac{1}{\sigma\sqrt{2\pi}} e^{-\frac{(n-N)^2}{2\sigma^2}} \qquad \text{Eqn. 3}$$

where σ is the standard deviation for the distribution. We must assure that there are no clusters with negative numbers of molecule in the clusters. Thus, we require $$N-3\sigma>>0 \qquad \text{Eqn. 4}$$

In terms of the current carried, although the lighter clusters travel faster than the heavier clusters, the lower density of lighter clusters in the column offsets this difference. Thus, in this model, the current carried by a particular size cluster is proportional to the Gaussian probability. Current drops in steps as each cluster mass travels the path, L, and passes totally into the Faraday.

Figure 4:
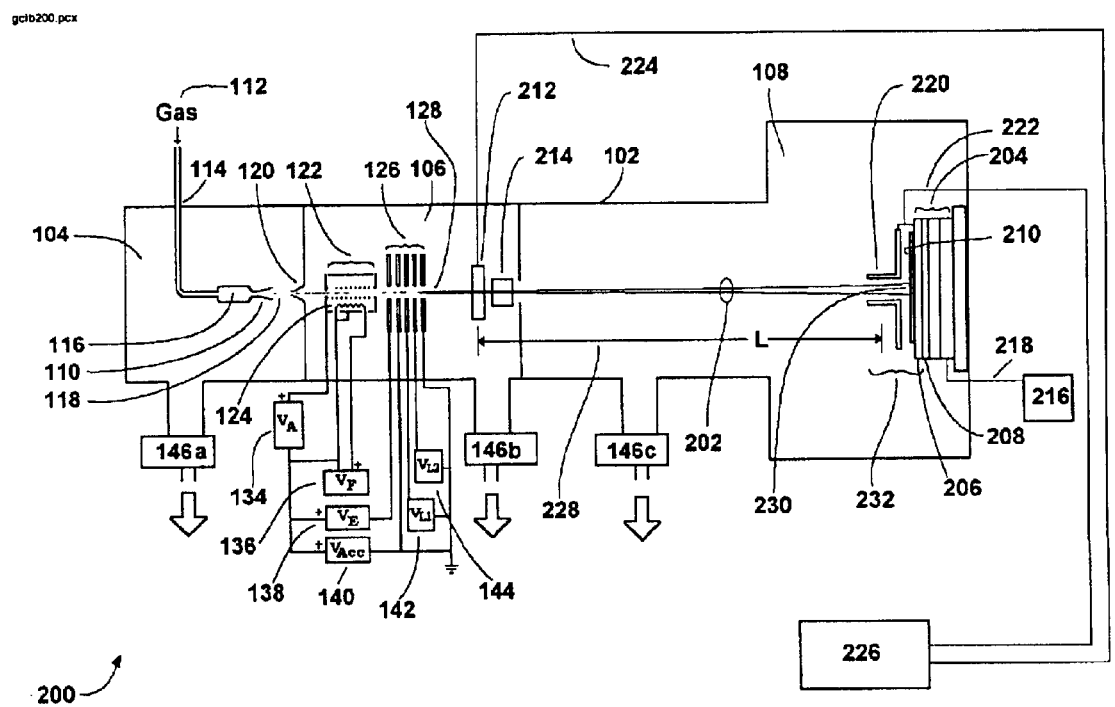
FIG. 4 is a schematic showing a GCIB apparatus having improvements according to the invention.

According to this invention, an improved GCIB apparatus as shown in FIG. 4 has a stationary GCIB and a mechanically scanned workpiece holder for scanning the wafer relative to the beam. Referring to the GCIB processing apparatus 200 of the invention shown in FIG. 4, a substantially stationary GCIB 202 is directed at a workpiece 210 that may be a semiconductor wafer, a metal substrate, or the like. Workpiece 210 is held on an X-Y positioning table 204 that is operable to move the workpiece in two axes, effectively scanning the workpiece 210 relative to the GCIB 202. The GCIB 202 impacts the workpiece 210 at a projected impact region 230 on a surface of the workpiece 210. By X-Y motion, the table 204 can position each part of a surface of the workpiece 210 in the path of GCIB 202 so that every region of a surface of workpiece 210 may be made to coincide with the projected impact region 230 for processing by the GCIB. An X-Y controller 216 provides electrical signals to the X-Y positioning table 204 through electrical cable 218 for controlling the position and velocity in each of X-axis and Y-axis directions. The X-Y controller 216 may receive control signals from an overall system controller, not shown. X-Y positioning table 204 moves by continuous motion or by stepwise motion according to conventional X-Y table positioning technology to position different regions of the workpiece 210 within the projected impact region 230. The workpiece holding surface 206 of positioning table 204 is electrically conductive. A cylindrical enclosure 220 surrounding the GCIB 202 upstream of the workpiece 210 is electrically conductive. Together the workpiece holding surface 206 and the cylindrical enclosure effectively comprise a form of Faraday cup assembly 232 for collecting the GCIB current arriving at the workpiece 210 and workpiece holding surface 206. The workpiece holding surface 206 and the cylindrical enclosure 220 are electrically connected together by electrical lead 222. An electrically insulating layer 208 of positioning table 204 isolates the workpiece 210 and workpiece holding surface 206 from the other portions of the positioning table 204. Electrical charge induced in the Faraday cup assembly by the GCIB 202 striking workpiece 210 is conducted through electrical lead 222 to cluster size measurement system 226 for measurement. An ionized beam switching beam gate 212 is disposed in the path of GCIB 202. Beam gate 212 has an open state for allowing the passage of ionized beam and a closed state for stopping the flow of ionized beam. A control cable 224 conducts control signals from cluster size measurement system 226 to beam gate 212, said control signals controllably switching beam gate 212 to either of its open or closed states for enabling or disabling the passage of ionized GCIB to the Faraday cup assembly 232. A flight distance 228 is symbolized by the symbol, L, and represents the distance an ion flies between the effective portion of the beam gate 212 and the effective location of the Faraday cup assembly 232. A beam filter 214 is, preferably but not necessarily, provided to eliminate molecular ions, or molecular ions and light cluster ions, from the GCIB 202. The beam filter uses conventional technology as described for example in U.S. Pat. No. 5,185,272 or U.S. Pat. No. 4,737,637.

It is recognized that the cluster size measurement system 226 may be implemented in a variety of ways and may include as a part of its control systems all or part of a programmable computer system. The X-Y controller 216 may include as part of its logic all or part of a programmable computer system. Some or all of the X-Y controller 216 and cluster size measurement system 226 logic may be performed by a small general purpose computer (not specifically shown) that also controls other portions of the GCIB processing apparatus 200. In operation, a GCIB is established and the cluster size measurement system 226 sends signals commanding the abrupt closing of the beam gate 212 to abruptly shut off flow of ionized beam to the Faraday cup assembly 232. The cluster size measurement system 226 measures the time variation of the GCIB current, I, collected by the Faraday cup assembly 232 during time from the closing of the beam gate 212 until beam current has ceased to be collected by the Faraday cup assembly 232, this includes the flight times over the distance, L, of all of the (fastest through slowest) ions. The cluster size measurement system 226 processes the current and time information to measure the average cluster size and/or mass and/or to measure the cluster size and/or mass distribution in the GCIB. The processing and measurements are made according to other principles of the invention taught hereinafter. A display system 240 receives processed information from measurement system 226 and displays digital and/or graphical cluster size and cluster size distribution characteristics.

Although FIG. 4 shows a Faraday cup assembly 232 as the means for current collection as an example and not for limitation, it is recognized that a variety of alternative current collection arrangements can be utilized in the invention. Although a beam gate 212 is shown in a particular location downstream of the high voltage electrodes 126, and is shown, for example and not for limitation, to be of a type similar to the repeller electrode gate shown in more detail in FIG. 8, it is recognized that a variety of means and locations for abruptly gating off and on the flow of ions are allowable for effective operation of the invention (several are discussed hereinafter). It is important for the invention to have an upstream means of abruptly gating off and on the flow of ions and a downstream means of measuring the time relationship of ion current, the gating and measurement separated by an ion flight distance, L.

Figure 5:
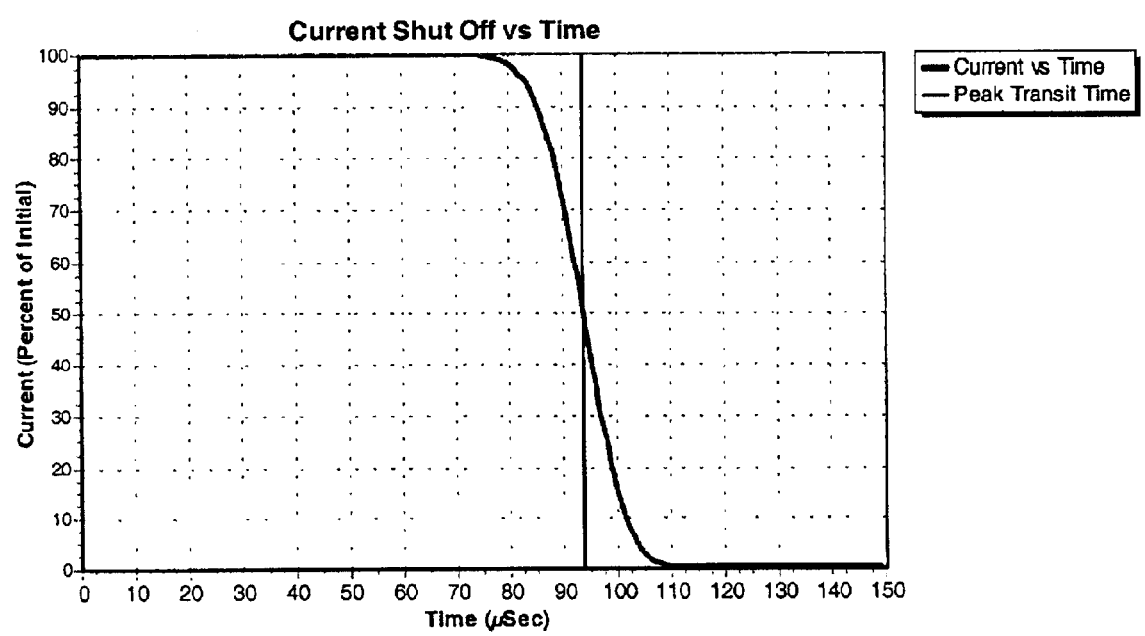
FIG. 5 shows a graph of the simulated current shut off for a beam with N=3000 molecules and σ=400 molecules.
Figure 6:
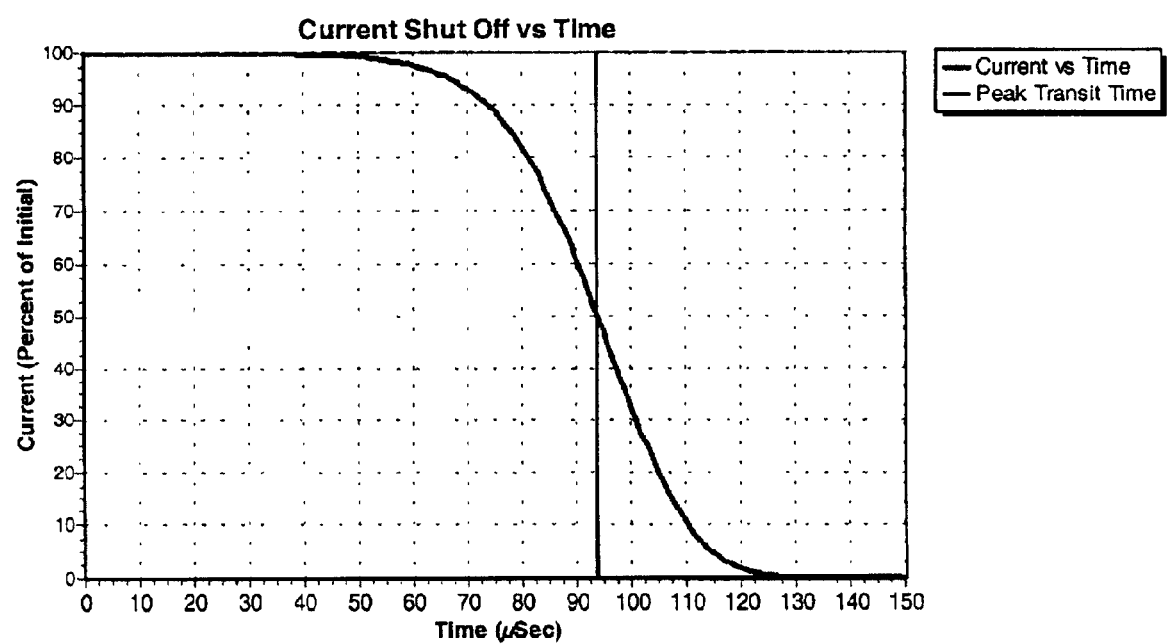
FIG. 6 shows a graph of the simulated current shut off for a beam with N=3000 molecules and σ=900 molecules.

FIG. 5 shows results from a computer model simulating the current shut off for a 20 keV beam with a distribution having a peak (average) of 3000 argon molecules per cluster and a standard deviation of 400 molecules. The 50% point corresponds very closely to the transit time for the peak of the distribution, which for the symmetrical Gaussian, is the average. The 10 to 90% fall time for the current is dependent on the width of the distribution. FIG. 6 shows the current shut off for a beam similar to that in FIG. 5, but with a 900 molecule standard deviation. The slower fall time is evident. However, note that the distribution about the 50% line is not symmetric, showing that a simple time derivative will not return the initial distribution.

Figure 7:
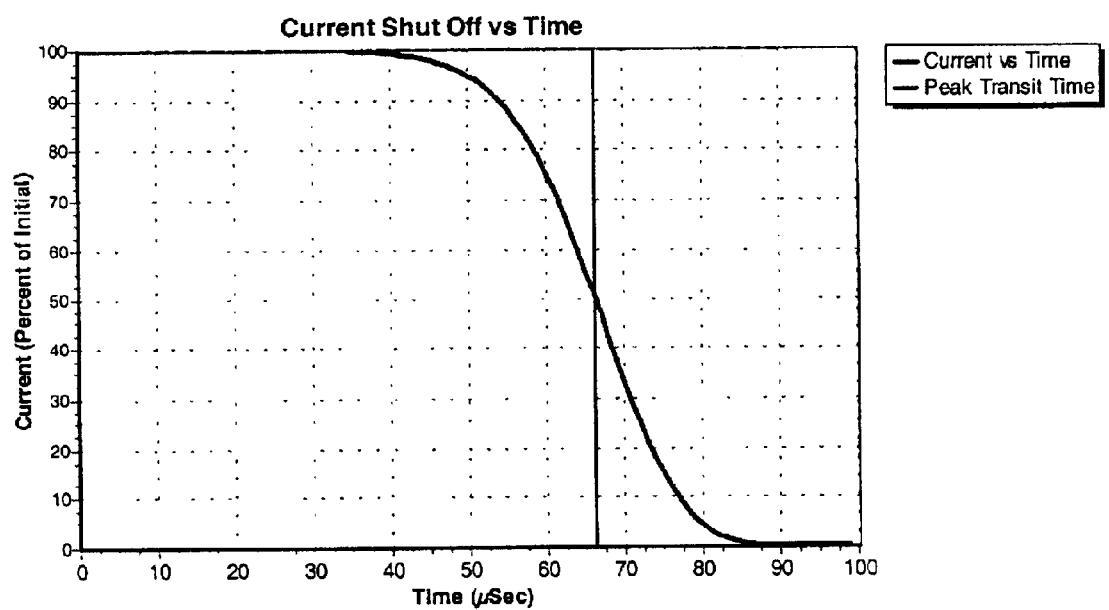
FIG. 7 shows a graph of the simulated current shut off for a Beam with N=1500 molecules and σ=400 molecules.

Of course, with changes in energy and mean cluster size, the time to the 50% point will change. FIG. 7 shows the current shut off for a 20 keV beam with an average of 1500 molecules per cluster and again a standard deviation of 400 molecules. In this case the 50% point has moved in to about 67 $\mu$sec.

FIGS. 5 through 7 help to understand the requirements for the beam gate to be used in the invention. When we are primarily interested in the average cluster size then the shutter closure must be fast compared to the 50% delay time. Such a beam gate requires a switching time, for the example, of less than 5 $\mu$sec. In order to extract information on the cluster size distribution, then the beam gate switching time needs to be fast compared to the current fall time. In this case, the closure time should be 1 $\mu$sec or less, for the example.

Figure 8:
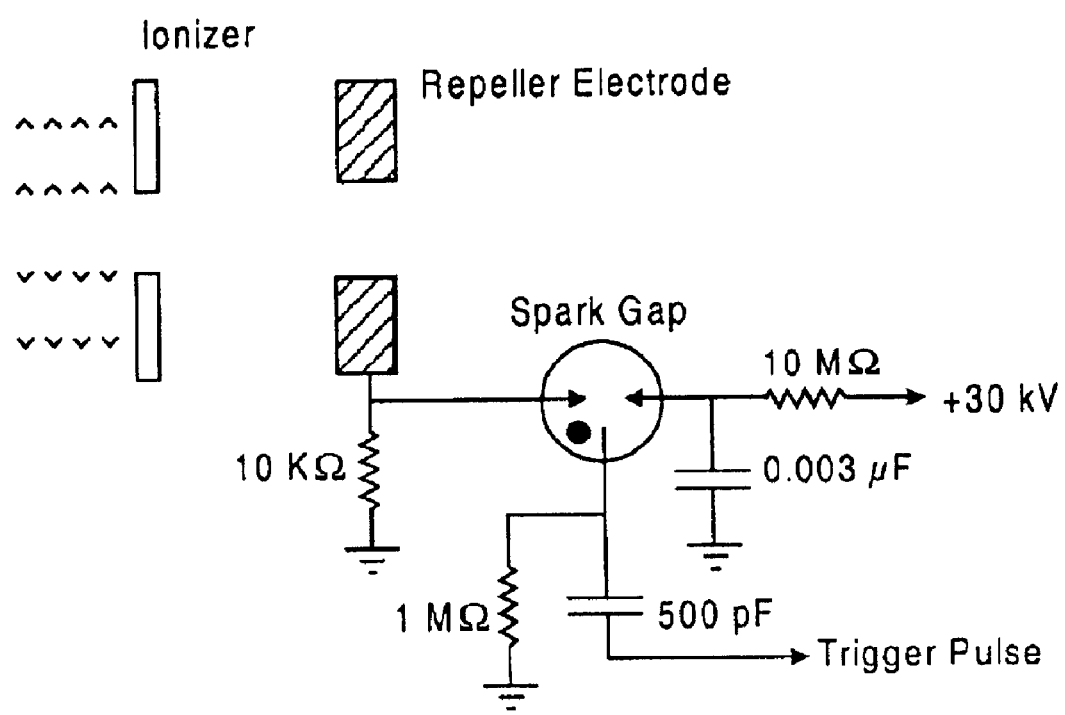
FIG. 8 is a schematic showing an electronic beam gate for gating a GCIB according to the invention.

FIG. 8 shows the design for a true electronic beam gate. A charged beam repeller electrode is added in the beam path to serve as a beam gate. The resistor normally grounds this electrode. However, when the spark gap is triggered, the 0.003 $\mu$F capacitor will discharge into the 10 kohm resistor bringing the electrode up to +30 kV (chosen to be greater than the 20 kV beam acceleration voltage, $V_{ACC}$. This will repel the ionized beam and prevent it from going through the electrode opening. The capacitor will then discharge with the RC time constant (a few 100 microseconds) and eventually will recharge through the 1 Mohm resistor allowing a repetition.

It is recognized that the repeller electrode shown in FIG. 8 could be a separate electrode as shown, or could even be incorporated into the set of high voltage electrodes, 126 shown in FIG. 4. In the latter arrangement, the 10 kohm resistor would return to a power supply instead of to ground. Some damping in the discharge circuit can be added if desired to minimize ringing of the voltage on the repeller electrode. This damping resistance can be low since the stray capacitance and inductance of the circuit can be made quite low. In any event a 1 $\mu$sec fall time is easily achievable. Conventional spark gaps can easily handle this service (~1 Joule of stored energy) and can be repetitively pulse at a few hertz. The required spark gap is small and be commercially purchased at modest cost. Another concern is the 0.003 $\mu$F capacitor, which is can be somewhat large and about as expensive as the spark gap, but is commercially available.

Figure 9:
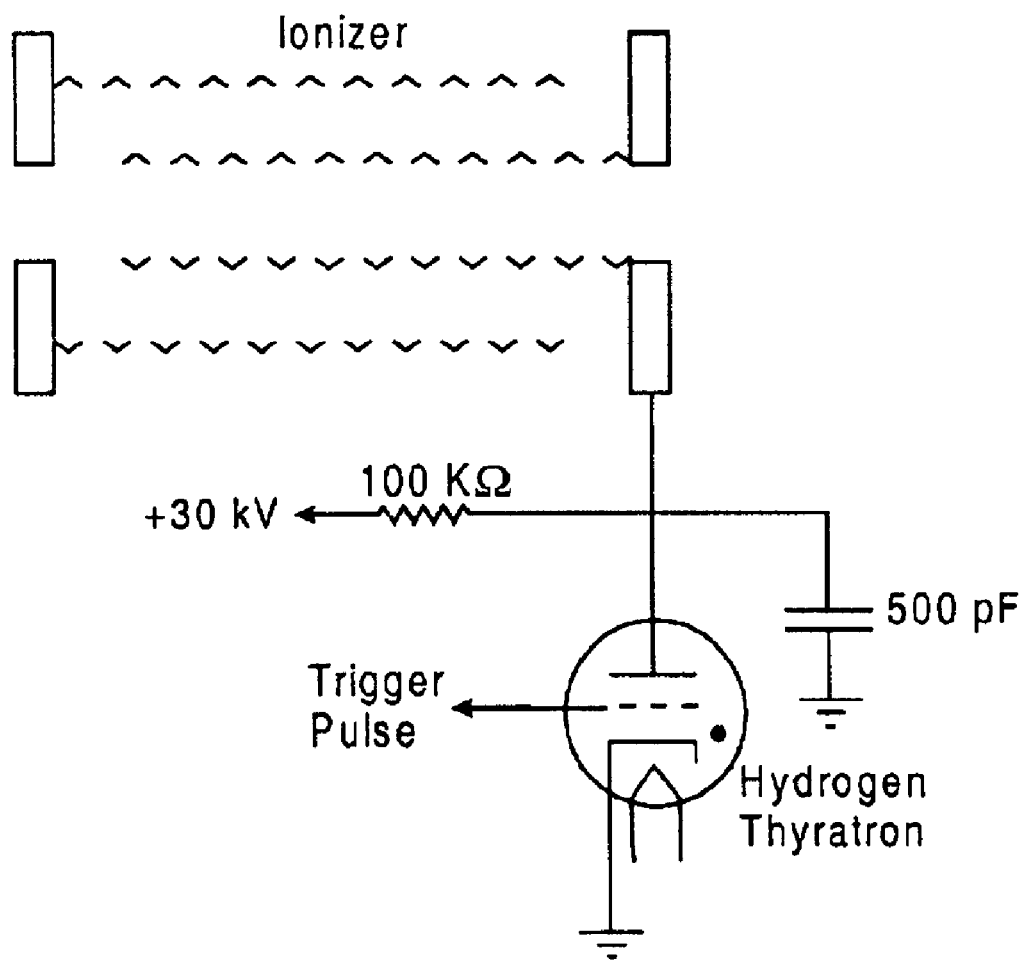
FIG. 9 is a schematic showing an extraction switching technique for gating a GCIB according to the invention.

An alternative way of gating the ionized beam is to shut off or enable extraction of the beam from the ionizer. An example of this is shown in FIG. 9. In this case, a hydrogen thyratron is used to shut off the extraction voltage. The stored energy is even less than in the case of the repeller electrode design and the capacitor requirements are less demanding. A conventional "doorknob" capacitor is readily available and can be used. A glass hydrogen thyratron costs a few tens of dollars and can be switched at 10's of Hertz with simple solid state trigger electronics. Stray capacitance and inductance would be more significant than in the repeller electrode case, but ringing prevention can be achieved by conventional methods. A bigger problem is the fact that the supplies floating at extraction voltage experience large transients, which could reduce their reliability. An alternative to extraction switching would be to include an additional electrode at the exit of the ionizer and to pulse this positively.

Figure 10:
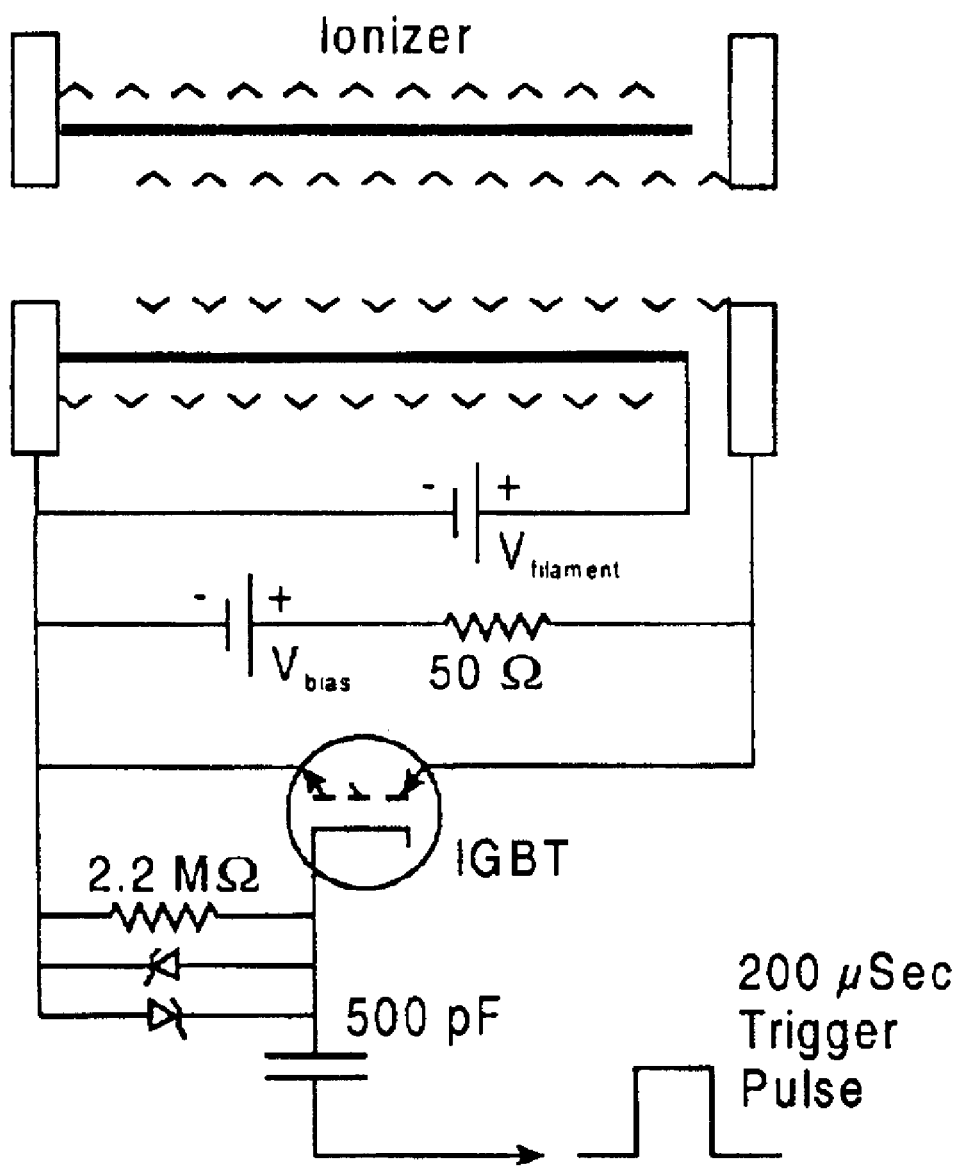
FIG. 10 is a schematic of a technique for ionization switching of a GCIB according to the invention.

FIG. 10 shows an example of gating the ionized beam by switching the ionizer on and off. Here the anode bias voltage of the ionizer, $V_{bias}$, (corresponds to $V_A$ in FIGS. 2 and 4) is used to extract electrons from the thermionic filaments is switched to the negative filament potential (negative side of $V_{filament}$ in FIG. 10, and corresponding to the negative side of $V_f$ in FIGS. 2 and 4). This effectively terminates any electron emission current from these filaments and will shut down ionization of the clusters very rapidly. However, switching time is limited by the transit time of the ionized clusters down the (for example, 1.5") length of the ionizer 122. This will give a switching time of about 5 $\mu$sec, adequate for average mass determination but marginal for examining the size distribution. The circuitry is floating at acceleration potential, so the insulated gate bipolar transistor (IGBT) is triggered from ground potential using, for example, the 500 pF blocking capacitor shown in FIG. 10. Alternatively, a 30 kV isolated pulse transformer or other conventional methods can be used. A pulse transformer has the advantage of isolating the IGBT from any extraction voltage turn on transients or transients due to arcing in the extraction column. Note that this same circuitry could be used for pulsing the extra electrode mentioned in the previous section. A few hundred volts would be adequate to block all ions.

Figure 11:
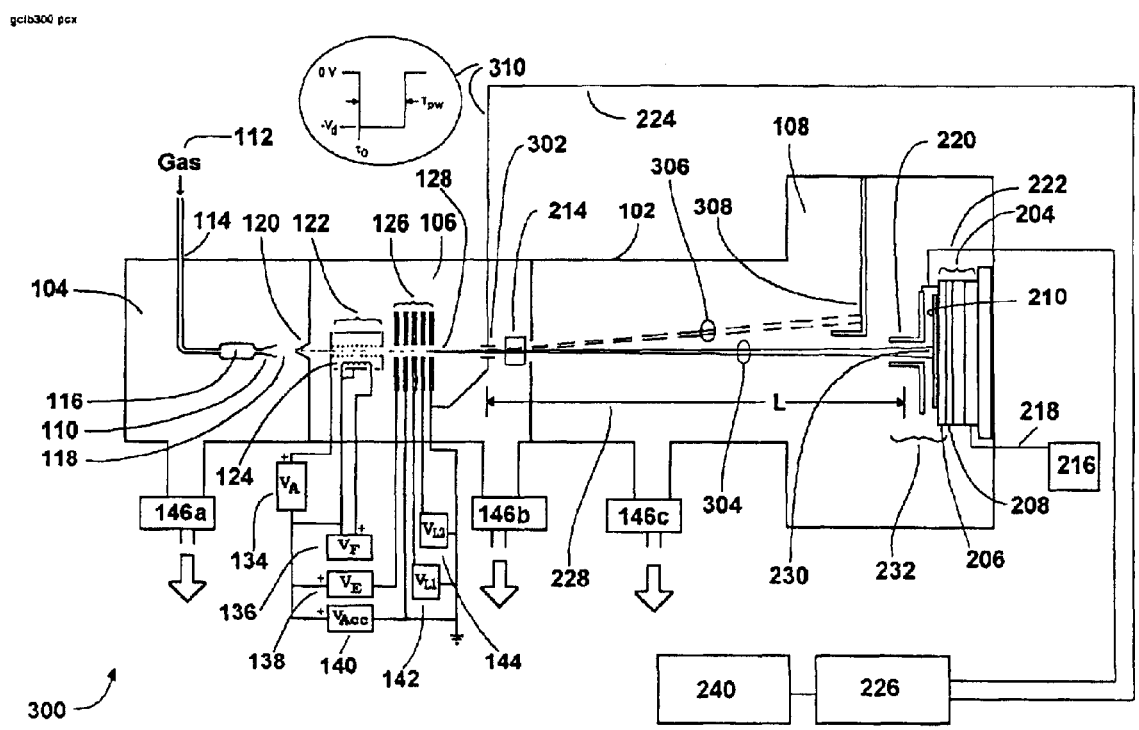
FIG. 11 is a schematic showing a GCIB apparatus with deflection switching of a GCIB according to an embodiment of the invention.

FIG. 11 shows a GCIB processing apparatus 300 according to an alternate embodiment. In the processing apparatus 300, gating the ionized beam is accomplished by deflection switching the GCIB 128. In this embodiment, a pair of deflection plates 302 receive a high voltage deflection pulse 308, creating an electric field that deflects the gas cluster ion beam away from its initial trajectory. The deflection pulse 308 is generated by the measurement system 226 and has a duration, $T_{pw}$, greater than the time-of-flight of the slowest cluster ions over the flight distance 228, L. The deflection pulse 308 has an amplitude of $-V_d$ that is typically on the order of a few kilovolts and suffices to deflect the GCIB 128 from its initial trajectory 304 to a second trajectory 306. The GCIB's initial trajectory 304 strikes the workpiece 210 at a projected impact region 230 on the surface of the workpiece 210 for processing the workpiece 210. The projected impact area 230 is within a Faraday cup assembly 232 for beam current collection. When the measurement system 226 actuates the deflector with deflection pulse 308 at a time t0, the initial trajectory 304 of the GCIB is deflected to the second trajectory 306. The second trajectory 306 impacts a beam stopper 308 that is outside of the Faraday cup assembly 232. The rise and fall times of the deflection pulse 308 are short (of the order of 1 microsecond or less) so as to abruptly deflect the GCIB out of or into the Faraday cup assembly 232, which acts as a current sensor. The current sensed in the Faraday cup assembly 232 is conducted to the measurement system 226 on electrical lead 222. When the deflector switches the beam out of or into the Faraday cup, the corresponding fall or rise in current collected by the Faraday cup assembly 232 is processed by the measurement system according to the method of the invention and GCIB cluster size or cluster size distribution information is displayed on the display system 240.

There are other means for switching the beam current off or on quickly, but one, particularly deserves some consideration. Arcing normally occurs occasionally in the extraction electrode set. This causes a momentary drop out of the current in the beam. By detecting these naturally occurring beam dropouts and measuring the beam current shut off transient, the cluster size can be estimated from time-of-flight. The timer for the current fall would be triggered from the arc and the time to the drop out at the Faraday or other current sensor measured.

A number of techniques can be used to shut down the ionized cluster ion beam and determine the effect on the measured current. Gating techniques have been given for example, not limitation, and numerous approaches to abrupt gating of the beam will occur to those skilled in the arts. The Faraday cup or other beam sensing system, which has been designed for the mechanically scanned smoother must be fast enough to accurately record the signals shown in FIGS. 5–7. This can be achieved with conventional designs. The most difficult element is the beam switching, with several practical methods available. Ionization switching is the preferred approach due to its simplicity, but the active gate using a repeller electrode (FIG. 8) and the beam deflection method (FIG. 11) are both also quite simple and effective. The additional switching electrode at the exit of the ionizer can be implemented with minor modifications and uses the same circuitry as the ionization switching. This approach overcomes the limitation imposed by the finite transit time down the ionizer. Suitable software can be written to measure and display average cluster size and distribution width, and this is discussed in additional detail below. The cluster size and distribution information is most valuable during beam set up and tuning prior to workpiece processing, but suitable circuitry, it is also possible to measure both the current and the cluster size during the overscan time of the mechanical scanning.

Above it has been explained that gating off the ionized beam abruptly gives a signal in the Faraday cup that allows determination of the average mass of the clusters in the beam. The following discussion shows how to extract the full cluster number distribution from the signal. The cluster number distribution can be readily converted to the cluster mass distribution by multiplying by the mass of the molecules forming the clusters. Although the discussion refers to the measurement and processing of the beam shut off current fall signals when the beam is gated off, it is readily appreciated that a fully analogous situation occurs when the beam is abruptly restored (gated on) and measurement and processing of the beam restoration current rise can equally be used as a means of implementing the invention.

As previously explained, the switch shutting off the beam must be very fast compared to the ion flight times over the distance, L. Immediately after gating, the beam then consists of a column of ionized clusters of varying masses and velocities traveling from the gate to the Faraday cup. The beam current, I, received by the Faraday cup will begin to shut off when the smallest and, therefore, the fastest clusters travel the distance from the gating point to the Faraday cup. Current will be shut off completely when the largest (slowest) clusters travel this same distance. A number of techniques for accomplishing the switching were discussed previously. For simplicity, it is here assumed that the clusters are gated at the exit of the high voltage electrodes, so that the critical path length is the distance, L, between the gate at the exit of the high voltage electrodes and the Faraday cup. For a Gaussian number distribution the beam current in the Faraday is $$I(t) = 1 - \sum_{n=0}^{\infty} f\left(t - \frac{L}{v(n)}\right) \frac{1}{\sqrt{2\pi}\,\sigma} e^{-\frac{(n-N)^2}{2\sigma^2}} \quad \text{Eqn. 5}$$

where N is the average number of molecules per cluster, $\sigma$ is the standard deviation, and $$f\left(t - \frac{L}{v(n)}\right) = \begin{cases} 1 & t \geq \frac{L}{v(n)} \\ 0 & t < \frac{L}{v(n)} \end{cases} \quad \text{Eqn. 6}$$

Here v(n) is the velocity of a cluster with n molecules, namely, $$v(n) = \sqrt{\frac{2qV_{Acc}}{m_p m_a n}} \quad \text{Eqn. 7}$$

Note that a particular size cluster, n, does not affect current until $$v(n) = \frac{L}{t} \quad \text{Eqn. 8}$$

At a given time, t, the cluster size that affects current is $$n = \frac{2qV_{Acc}}{m_p m_a} \left(\frac{t}{L}\right)^2 \quad \text{Eqn. 9}$$

where $m_p$ represents the atomic mass unit, $m_a$ represents the atomic mass number of the type of the individual atoms or molecules from which the cluster are formed, and n represents the number of molecules (atoms in the case of monatomic gases) in the cluster.

Let us assume that there are so many different size clusters that we approximate the result for the current by a continuous rather than discrete variable. Then the current becomes.

$$I(t) = 1 - \int_0^{\frac{2qV_{Acc}}{m_p m_a}\left(\frac{t}{L}\right)^2} \frac{1}{\sqrt{2\pi}\,\sigma} e^{-\frac{(n-N)^2}{2\sigma^2}} \quad \text{Eqn. 10}$$

Taking the negative derivative of this expression yields $$I'(t) = -\frac{dI(t)}{dt} = \frac{4qV_{Acc}}{m_p m_a} \frac{t}{L^2} \frac{1}{\sqrt{2\pi}\,\sigma} e^{-\frac{\left(\frac{2qV_{Acc}}{m_p m_a}\left(\frac{t}{L}\right)^2 - N\right)^2}{2\sigma^2}} \quad \text{Eqn. 11}$$

or $$e^{-\frac{(n-N)^2}{2\sigma^2}} = \frac{\sqrt{2\pi}\,\sigma m_p m_a L^2}{4qV_{Acc}} \left(-\frac{1}{t}\frac{dI(t)}{dt}\right) \quad \text{Eqn. 12}$$

Note that, nowhere in this derivation was assumption made that the distribution is Gaussian or any other form. Thus, more generally, the normalized probability distribution is $$f(n) = \frac{-\frac{1}{t}\frac{dI(t)}{dt}}{\left(-\frac{1}{t}\frac{dI(t)}{dt}\right)_{Maximum}} \quad \text{Eqn. 13}$$

Note that the distribution must be plotted against n, as given in Eqn. 9.

The foregoing derivation has assumed that the clusters all bear the same charge, q, a multiple of the of the unit charge, e. However, in general the clusters have a distribution in both size, n, and in charge, q. At the present, there is no easy separation of these distributions. Consequently in this case the time-of-flight measurement measures the joint distribution. Note that the velocity of the particles is dependent on n/q (Eqn. 8) and that the solution for n (Eqn. 9) may just as readily be expressed as a function of n/q. This is a result of the electrostatic nature of the acceleration system. In any event, all of the foregoing derivations follow in exactly the same manner as above except that the probability distribution function becomes likewise f(n/q) rather than merely f(n). While this generalization somewhat reduces the utility of the measurement, the time-of-flight derived f(n/q) distribution is very useful in determining consistency of operation in commercial production equipment and for facilitating the set-up of equipment operating parameters to achieve consistent processing. Moreover, it is often possible to infer the size distribution separately by operating the cluster ionizer at low levels so that it is unlikely that the clusters acquire more than a single charge each—in such case the assumption that q is the same for all cluster ions is justified.

A computer simulation has been written to perform the extraction of cluster size as outlined above by simulating the abrupt gating off of a cluster ion beam. The computer generates the current shut off signal based on the discrete sum (Eqn. 5), using either the Gaussian probability distribution above or a Poisson distribution of the form $$f(n) = \frac{(m+1)^{m+1}}{m!N}\left(\frac{n}{N}\right)^m e^{-(m+1)\frac{n}{N}} \quad \text{Eqn. 14}$$

where m is the order of the distribution.

The simulation is a discrete approximation that uses 50 equally spaced points between the 100% and 0% points of the current shut off signal in exactly the same way that a periodically sampling data acquisition system does. The normalized derivative defined by Eqn. 13 is then calculated. When plotted against cluster size in the beam, the derived distribution is compared with the initial distribution. Some results of the simulation are shown in FIGS. 12 and 13 and in FIGS. 15 and 16 and discussed in below.

FIG. 7, as previously described, shows the current signal for a 20 keV beam with a cluster size distribution that is normally distributed and which has an average size of 1500 argon molecules per cluster and a standard deviation of 400 molecules.

Figure 12:
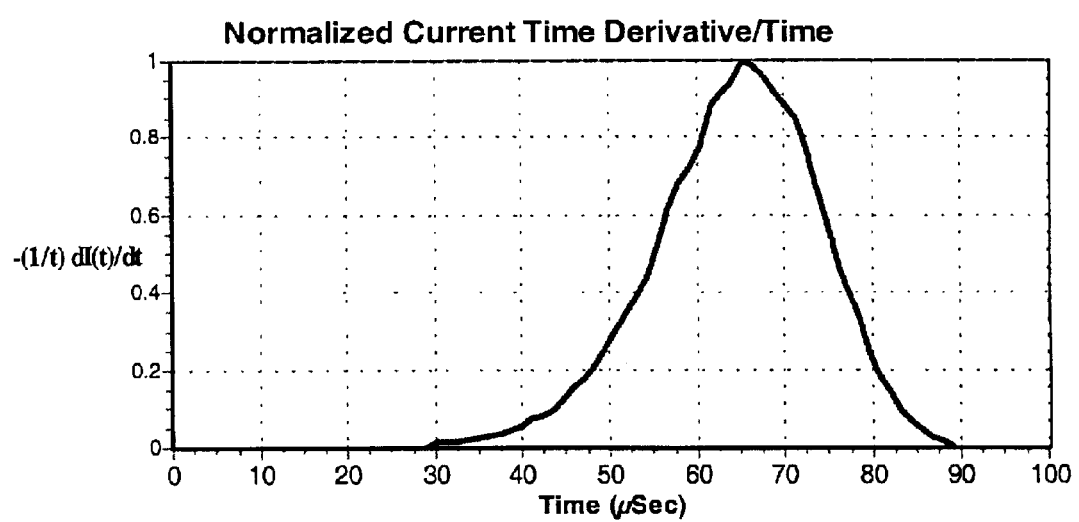
FIG. 12 shows a graph of a normalized negative derivative divided by time for Gaussian cluster distribution (N=1500;σ=400)

FIG. 12 shows the normalized negative derivative of the current signal from FIG. 7 divided by time. The variations (wiggles in the curve) are the result of the numerical approximation derivative in the simulation.

Figure 13:
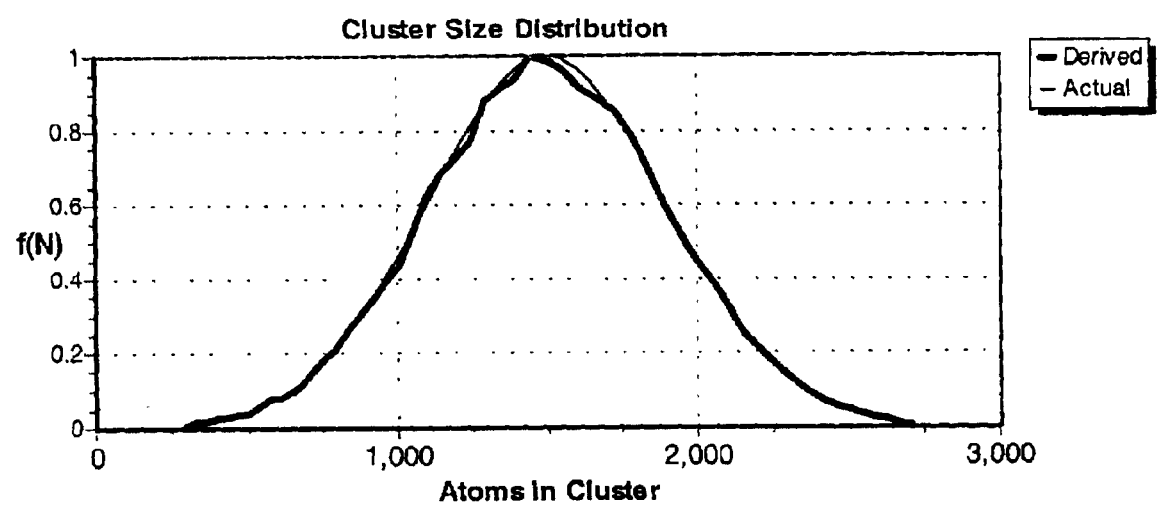
FIG. 13 shows a graph comparing the initial (Gaussian) distribution with derived distribution (N=1500;σ=400)

FIG. 13 shows this same distribution of FIG. 12 plotted against cluster size rather than time. The derived distribution is compared to the initial Gaussian distribution. Note that the agreement is excellent despite the numerical approximation of the derivative.

Figure 14:
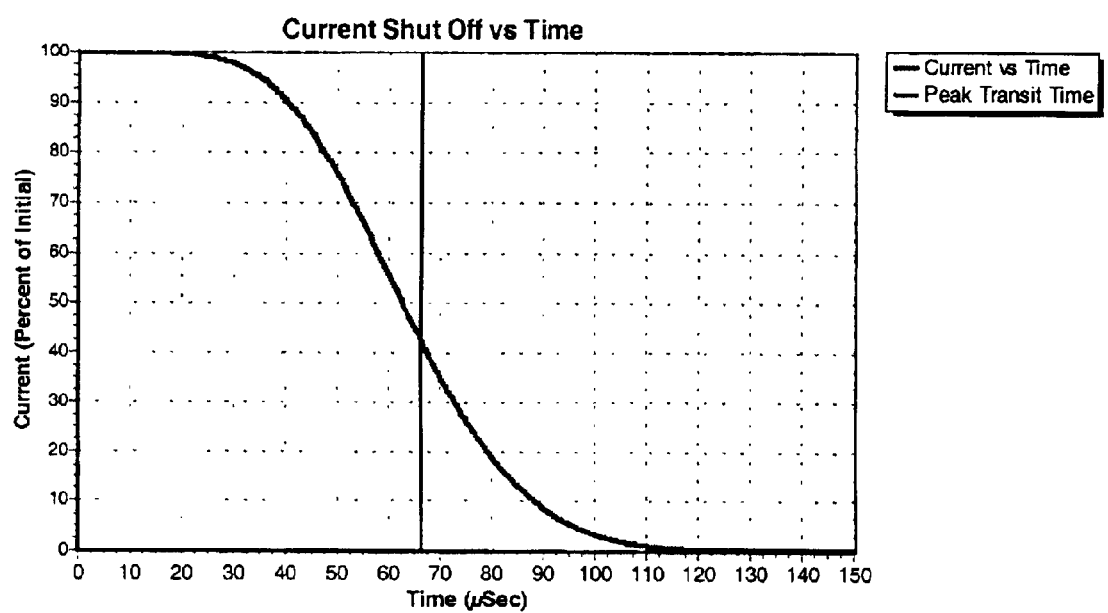
FIG. 14 shows a graph of the current shutoff for a Poisson cluster distribution (N=1500; m=2)

FIG. 14 shows the current shut off for a cluster size distribution having Poisson statistics of order 2. Note that in this case the average cluster size does not occur at the 50% point. For the Poisson distributions, the average occurs below the 50% point. As the order is increased then the average approaches the 50% point.

Figure 15:
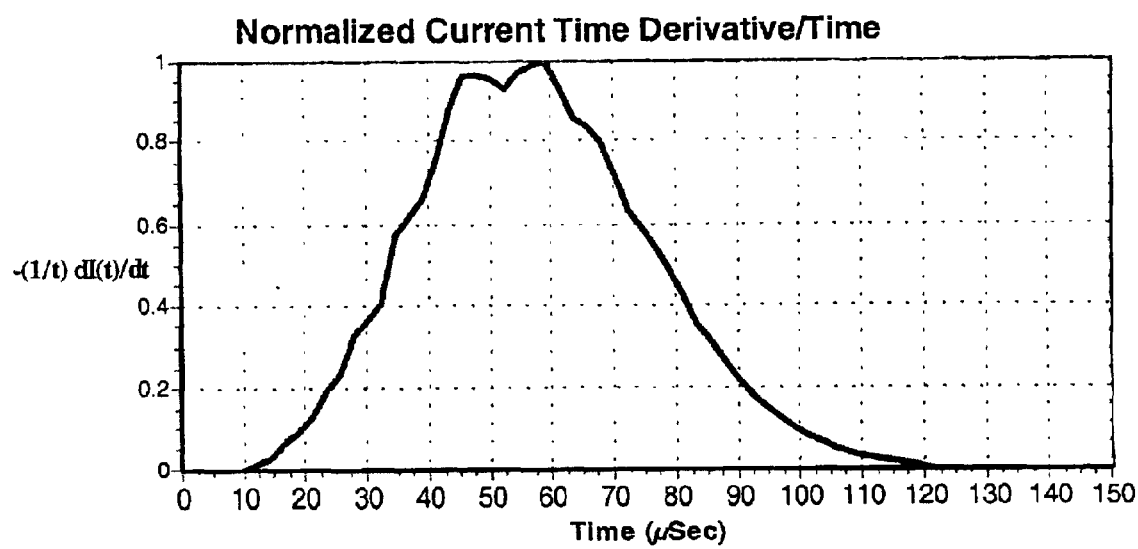
FIG. 15 shows a graph of the normalized negative derivative divided by time for a Poisson cluster distribution (N=1500; m=2)

FIG. 15 shows the normalized time derivative of the signal of FIG. 14 divided by time. It is recognized that smoothing techniques could be employed to improve the faithfulness of the derivative. For the Poisson distribution, the peak of the number distribution occurs at a number well below the average, so that more clusters have a lower time-of-flight than for the Gaussian distribution. This is offset by the longer tail at high masses, thus giving the same average.

Figure 16:
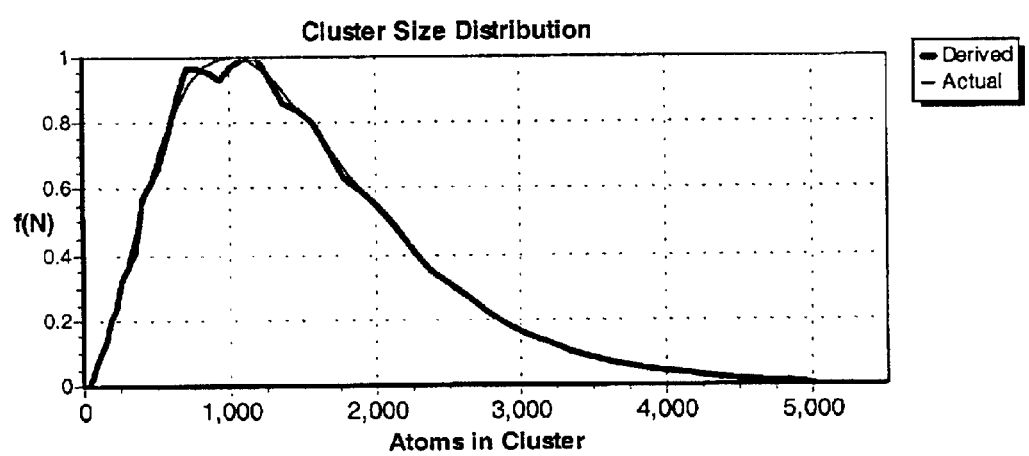
FIG. 16 shows a graph comparing the initial (Poisson) distribution with derived distribution (N=1500;m=2).

FIG. 16 shows the normalized time derivative of the signal of FIG. 14 plotted against the corresponding cluster size. Again, note the excellent fit, despite the rather dramatic change in the cluster distribution (Poisson versus Gaussian).

The process described here allows a full extraction of the cluster size distribution in the beam. Note that the process involves taking a derivative of the signal and dividing by time. The simulation illustrated above mimics very well the deconvolution process that would be followed assuming the signal is taken as periodic samples with a conventional data acquisition system. Note that in comparison to the more usual pulsed time of flight, the signal levels here are high level and easily read with low noise. The simulation can easily be modified to take into account a finite switching time. This is expected to give a slight offset in the derived distribution but for the cluster sizes expected, the offset should be negligible. While the emphasis here has been on cluster statistics, any molecular ions present in the beam can also be detected. In a beamline including a molecular ion filter, none are ordinarily present and the possible failure of the molecular ion filter is detectable.

Figure 17:
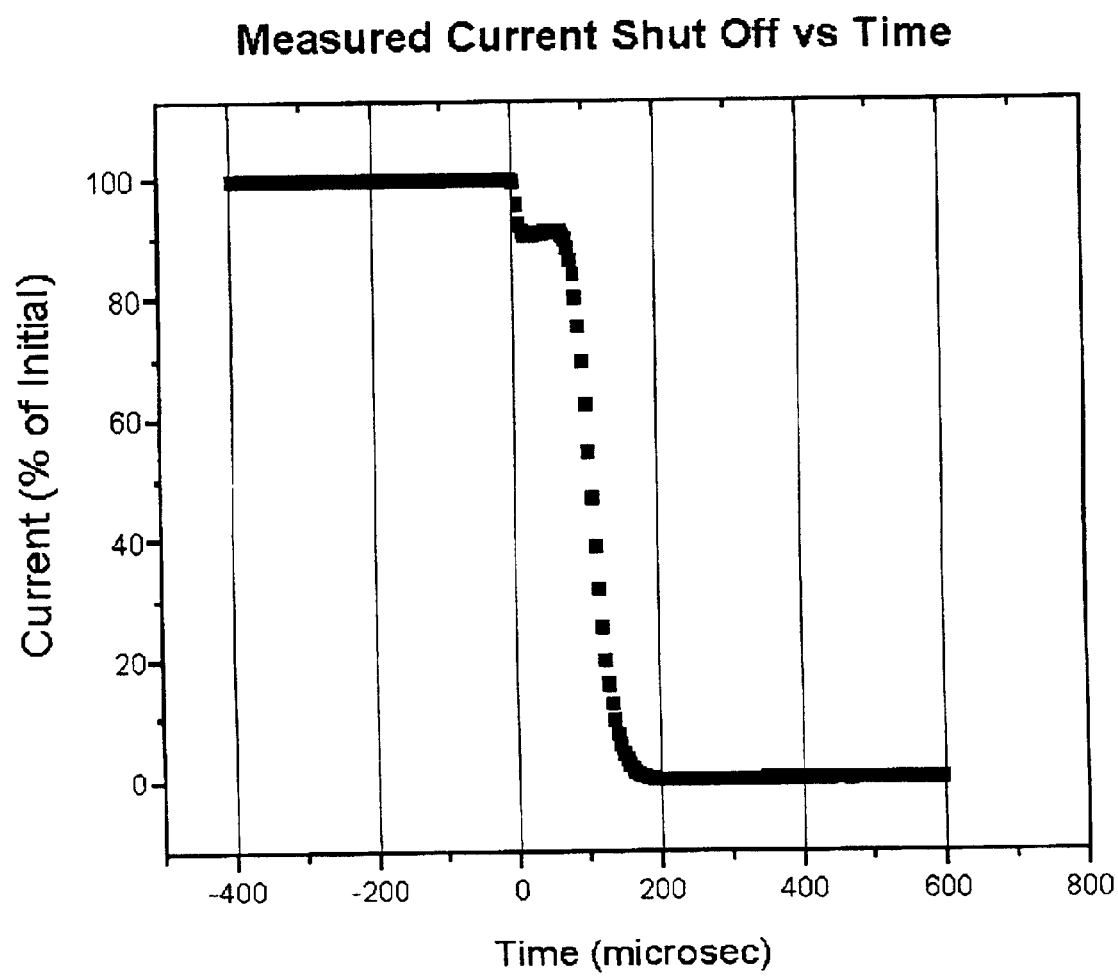
FIG. 17 shows a graph of the measured current shut off for a GCIB gated off using deflection switching according to the invention.
Figure 18:
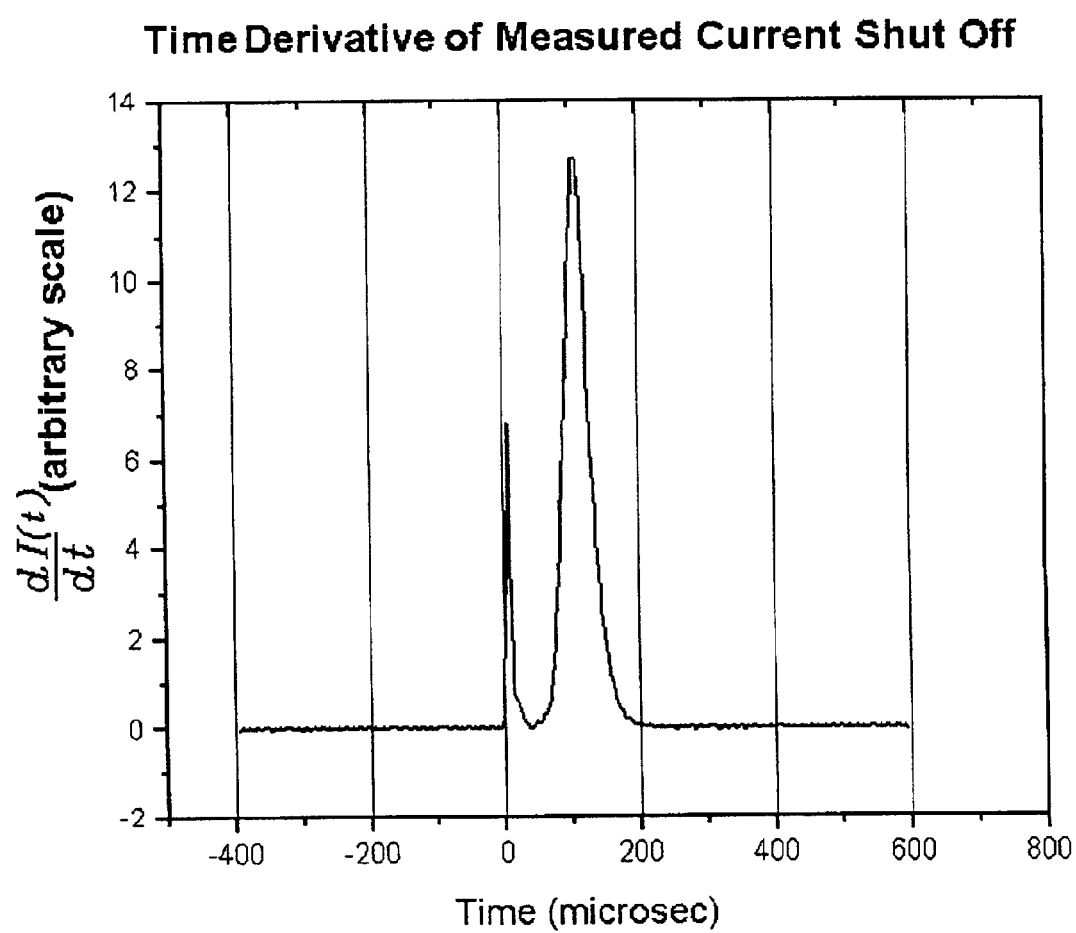
FIG. 18 shows a graph of the time derivative of the measured current shut off shown in FIG. 17.
Figure 19:
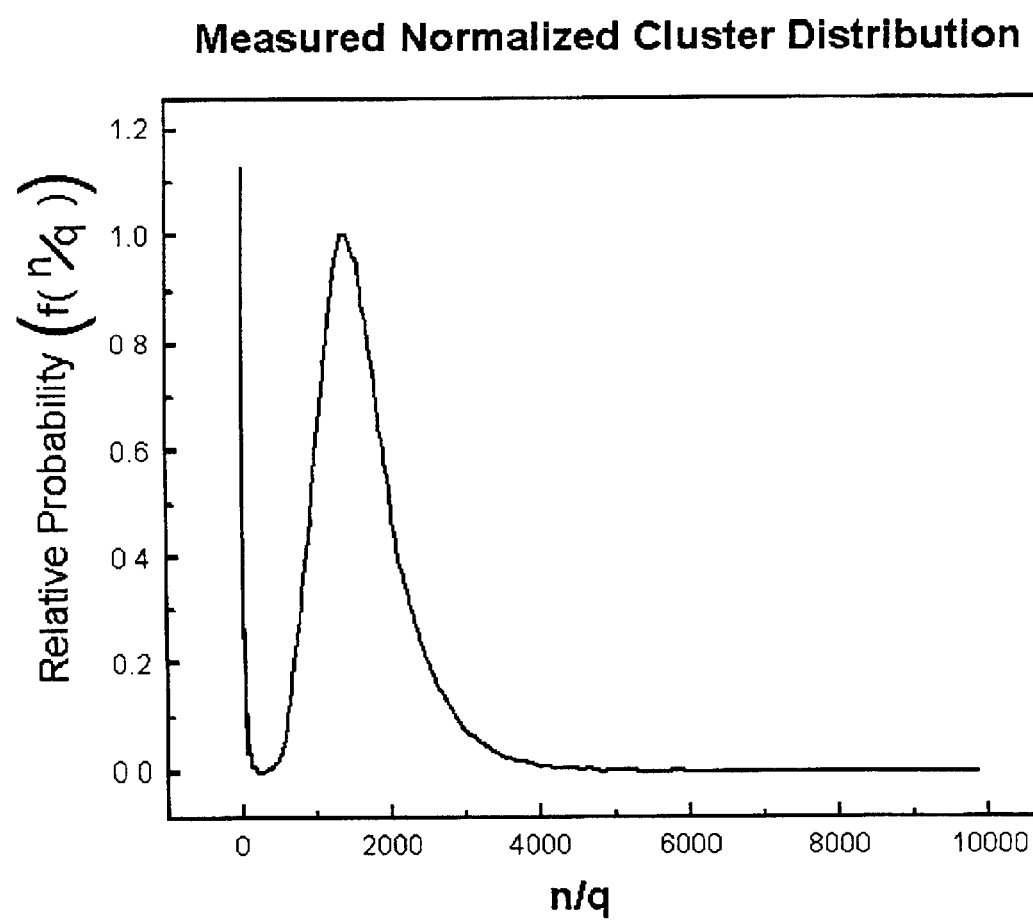
FIG. 19 shows a graph of the cluster probability distribution function, f(n/q), corresponding to the current shut off characteristic measurement shown in FIG. 17 and obtained according to the invention.

FIGS. 17, 18, and 19 show results of measurements and analysis made using the invention in a gas cluster ion beam processing system as shown in FIG. 4, where the beam gating device 212 is of the deflection switching type as previously detailed in FIG. 11. A beam filter 214 was present in the gas cluster ion beam processing system, but was purposely disabled so that molecular ions and low mass ions would be present in the GCIB. An argon gas cluster ion beam accelerated by a 3 kV acceleration voltage, $V_{acc}$, was used for this example. The cluster ion beam current, I, was on the order of 10 microamps and was collected in a Faraday cup. The flight distance, L, was approximately 34 cm. The measurement system 226 collected periodic digitized samples of the collected beam current, I, and processed according to the principles of the invention discussed hereinabove.

FIG. 17 shows a graph of the measured gas cluster ion beam current, I, shut off characteristics when the beam was gated off by the deflector. A prompt current decrease of about 10% of the initial value of the current is noted near to time zero due to the short time-of-flight of the molecular ions and other very light ions. By 200 microseconds all the beam current received in the Faraday cup is completely cut off.

FIG. 18 shows a graph of the time derivative of the measured current shut off signal shown in FIG. 17.

FIG. 19 shows a graph of the f(n/q) cluster probability distribution function corresponding to the current shut off characteristic measurement in FIG. 17 and obtained according to the invention, plotted against n/q. Note the peak near n/q=zero, representing the molecular ions and smallest clusters and the later peak near n/q=1300 representing the peak of the main cluster distribution. This graphical information is produced by measurement system 226 and displayed by display system 240 of the invention.

Although the invention has been described with respect to various embodiments, it should be realized this invention is also capable of a wide variety of further and other embodiments within the spirit and scope of the appended claims.

What is claimed is:

1. An apparatus for gas cluster ion beam (GCIB) processing including mass or cluster size diagnostics for improving GCIB workpiece processing, comprising:

a vacuum vessel;

a gas cluster ion beam source within the vacuum vessel for producing a gas cluster ion beam;

an accelerator for accelerating the gas cluster ion beam along a trajectory;

a beam gate for controllably interrupting and restoring the gas cluster ion beam;

beam current measurement means disposed along the trajectory at a predetermined distance, L, from said beam gate;

workpiece holding means disposed along the trajectory for holding a workpiece for gas cluster ion beam processing;

control means for providing beam gating signals to said beam gate that controllably interrupt and restore the gas cluster ion beam;

time-of-flight measurement means for measuring the times-of-flight of components of the gas cluster ion beam over said distance, L; and a time-of-flight analyzer to analyze said times of flight of components of the gas cluster ion beam in order to provide output information relative to GCIB mass or cluster size;

wherein said output information is used in the gas cluster ion beam processing of the workpiece.

2. The apparatus of claim 1, further comprising display means for displaying the times-of-flight of components of the gas cluster ion beam.

3. The apparatus of claim 1, wherein the time-of-flight analyzer calculates the size or mass distribution of components of the gas cluster ion beam, and the apparatus further comprises display means for displaying the size or mass distribution of the components of the gas cluster ion beam.

4. The apparatus of claim 3 wherein the time-of-flight analyzer calculates the size or mass distribution by analyzing the beam current fall-off characteristics when the gas cluster ion beam is interrupted.

5. The apparatus of claim 3 wherein the time-of-flight analyzer calculates the size or mass distribution by analyzing the beam current rise characteristics when the gas cluster ion beam is restored.

6. The apparatus of claim 1, wherein the time-of-flight analyzer calculates the size-to-charge-ratio distribution of components of the gas cluster ion beam, and the apparatus further comprises display means for displaying the mass-to-charge-ratio of the components of the gas cluster ion beam.

7. The apparatus of claim 6 wherein the time-of-flight analyzer calculates the size-to-charge-ratio distribution by analyzing the beam current fall-off characteristics when the gas cluster ion beam is interrupted.

8. The apparatus of claim 6 wherein the time-of-flight analyzer calculates the size-to-charge-ratio distribution by analyzing the beam current rise characteristics when the gas cluster ion beam is restored.

9. The apparatus of claim 1, wherein the beam current measuring means comprises a faraday cup for collecting beam current signals.

10. The apparatus of claim 1, wherein the accelerator accelerates the gas cluster ion beam to a known energy in the range of from about 1 keV to about 50 keV.

11. The apparatus of claim 1, wherein the beam gate switches the beam on or off during a time that is shorter than the time-of-flight of the gas ion beam clusters of mean mass as they travel said distance, L.

12. An apparatus for gas cluster ion beam (GCIB) processing including mass or cluster size diagnostics for improving GCIB workpiece processing, comprising:
    a vacuum vessel;
    a gas cluster ion beam source within the vacuum vessel for producing a gas cluster ion beam;
    an accelerator for accelerating said gas cluster ion beam along a first trajectory;
    a beam deflector for controllably interrupting and restoring the gas cluster ion beam flow along the first trajectory by deflecting the gas cluster ion beam along a second trajectory;
    beam current measurement means disposed along the first trajectory at a predetermined distance, L, from said beam deflector;
    workpiece holding means disposed along the first trajectory for holding a workpiece for gas cluster ion beam processing;
    control means for providing beam deflecting signals to said beam deflector that controllably interrupt and restore the gas cluster ion beam;
    time-of-flight measurement means for measuring the times-of-flight of components of the gas cluster ion beam along said distance, L; and
    a time-of-flight analyzer to analyze said times of flight of components of the gas cluster ion beam in order to provide output information relative to GCIB mass or cluster size;
    wherein said output information is used in the gas cluster ion beam processing of the workpiece.

13. The apparatus of claim 12, wherein the beam deflector switches the gas cluster ion beam from the first trajectory to the second trajectory during a time that is shorter than the time-of-flight of clusters of mean mass as they travel said distance, L.

14. The apparatus of claim 12, further comprising display means for displaying the times-of-flight of components of the gas cluster ion beam.

15. The apparatus of claim 12, wherein the time-of-flight analyzer calculates the size or mass distribution of components of the gas cluster ion beam, and the apparatus further comprises display means for displaying the size or mass distribution of the components of the gas cluster ion beam.

16. The apparatus of claim 15 wherein the time-of-flight analyzer calculates the size or mass distribution by analyzing the beam current fall-off characteristics when the gas cluster ion beam is interrupted.

17. The apparatus of claim 15 wherein the time-of-flight analyzer calculates the size or mass distribution by analyzing the beam current rise characteristics when the gas cluster ion beam is restored.

18. The apparatus of claim 12, wherein the time-of-flight analyzer calculates the size-to-charge-ratio distribution of components of the gas cluster ion beam, and the apparatus further comprises display means for displaying the mass-to-charge-ratio of the components of the gas cluster ion beam.

19. The apparatus of claim 18 wherein the time-of-flight analyzer calculates the size-to-charge-ratio distribution by analyzing the beam current fall-off characteristics when the gas cluster ion beam is interrupted.

20. The apparatus of claim 18 wherein the time-of-flight analyzer calculates the size-to-charge-ratio distribution by analyzing the beam current rise characteristics when the gas cluster ion beam is restored.

21. The apparatus of claim 12, wherein the beam current measuring means comprises a faraday cup for collecting beam current signals.

22. The apparatus of claim 12, wherein the accelerator accelerates the gas cluster ion beam to a known energy in the range of from about 1 keV to about 50 keV.

23. An apparatus for gas cluster ion beam (GCIB) processing including mass or cluster size diagnostics for improving GCIB workpiece processing, comprising:
    a vacuum vessel;
    a gas cluster ion beam source within the vacuum vessel for producing a gas cluster ion beam;
    an accelerator for accelerating the gas cluster ion beam along a trajectory;
    a beam gate for controllably interrupting and restoring the gas cluster ion beam;
    beam current measurement means disposed along the trajectory at a predetermined distance, L, from said beam gate;
    control means for providing beam gating signals to said beam gate that controllably interrupt and restore the gas cluster ion beam;
    time-of-flight measurement means for measuring the times-of-flight of components of the gas cluster ion beam over said distance, L; and
    a time-of-flight analyzer to analyze said times of flight of components of the gas cluster ion beam in order to provide output information relative to GCIB mass or cluster size.

24. An apparatus for gas cluster ion beam (GCIB) processing including mass or cluster size diagnostics for improving GCIB workpiece processing, comprising:
    a vacuum vessel;
    a gas cluster ion beam source within the vacuum vessel for producing a gas cluster ion beam;
    an accelerator for accelerating said gas cluster ion beam along a first trajectory;
    a beam deflector for controllably interrupting and restoring the gas cluster ion beam flow along the first trajectory by deflecting the gas cluster ion beam along a second trajectory;
    beam current measurement means disposed along the first trajectory at a predetermined distance, L, from said beam deflector;
    control means for providing beam deflecting signals to said beam deflector that controllably interrupt and restore the gas cluster ion beam;
    time-of-flight measurement means for measuring the times-of-flight of components of the gas cluster ion beam along said distance, L; and a time-of-flight analyzer to analyze said times of flight of components of the gas cluster ion beam in order to provide output information relative to GCIB mass or cluster size.

25. A method of measuring a characteristic of an ion beam comprising the steps of:

projecting the ion beam along a path having a predetermined length;

collecting the ion beam current;

abruptly switching the ion beam at a time $t_0$ to produce a current transient;

measuring the current transient; and processing the current transient measurement to calculate a characteristic of the ion beam, said processing comprising taking a derivative of the current transient after time $t_0$.

26. The method of claim 25 further comprising the step of displaying the calculated characteristic of the ion beam.

27. The method of claim 25 wherein the ion beam is a cluster ion beam.

28. The method of claim 27 wherein the characteristic of the cluster ion beam is a cluster size.

29. The method of claim 27 wherein the characteristic of the cluster ion beam is a cluster size distribution function.

30. The method of claim 27 wherein the characteristic of the cluster ion beam is a cluster size-to-charge-ratio distribution function.

31. The method of claim 25 wherein the abruptness of the switching is less than the mean ion flight time across the predetermined length.

32. The method of claim 25 wherein the switching step comprises the step of switching the beam off and wherein the current transient is a current decrease.

33. The method of claim 25 wherein the switching step comprises the step of switching the beam on and wherein the current transient is a current increase.

34. The method of claim 25 wherein the processing step further comprises the step of taking a derivative of the current transient after time $t_0$.

35. The method of claim 25 wherein the processing step further comprises the steps of dividing the derivative of the current transient by time t, which is defined as the time required for the ion beam to travel along the predetermined length.

* * * * *